United States Patent [19]

Gladfelter

[11] Patent Number: 4,684,762

[45] Date of Patent: Aug. 4, 1987

[54] SHIELDING FABRIC

[75] Inventor: Harry F. Gladfelter, Phoenixville, Pa.

[73] Assignee: Raychem Corp., Menlo Park, Calif.

[21] Appl. No.: 735,883

[22] Filed: May 17, 1985

[51] Int. Cl.⁴ .................. H01B 7/34; H01B 13/26; D03D 15/02; D03D 23/00
[52] U.S. Cl. .................................. 174/36; 87/9; 139/425 R; 156/52; 156/53; 174/35 MS; 174/117 M; 174/DIG. 11; 428/229
[58] Field of Search ............... 174/36, 35 MS, 117 M, 174/DIG. 11; 87/1, 8, 9; 66/169 R, 170, 202, 232; 139/425 R; 428/229, 408, 922; 156/52, 53

[56] References Cited

U.S. PATENT DOCUMENTS

| | | | |
|---|---|---|---|
| 231,085 | 8/1880 | Pearson | 174/36 |
| 2,032,712 | 10/1931 | Morrison et al. | 174/107 |
| 2,585,054 | 2/1952 | Stachura | 174/36 |
| 3,089,915 | 5/1963 | Plummer | 174/36 |
| 3,195,395 | 7/1965 | McCallum | 87/1 |
| 3,253,618 | 5/1966 | Cook | 174/36 |
| 3,288,175 | 11/1966 | Valko | 139/425 R |
| 3,423,515 | 1/1969 | Eichberg | 174/36 |
| 3,582,445 | 6/1971 | Okuhashi | 428/922 X |
| 3,582,532 | 6/1971 | Plummer | 174/36 |
| 3,586,597 | 6/1971 | Okuhashi | 428/242 |
| 3,733,213 | 5/1973 | Jacob | 428/458 X |
| 3,839,672 | 10/1974 | Anderson | 324/51 |
| 3,877,965 | 4/1975 | Broadbent et al. | 427/304 |
| 3,946,143 | 3/1976 | McLoughlin | 174/DIG. 8 X |
| 3,986,530 | 10/1976 | Maekawa | 428/422 X |
| 4,016,356 | 4/1977 | McLoughlin | 174/DIG. 8 X |
| 4,042,737 | 8/1977 | Forsgren et al. | 428/253 X |
| 4,138,519 | 2/1979 | Mitchell | 428/95 |
| 4,232,082 | 11/1980 | Noritake | 428/922 X |
| 4,247,596 | 1/1981 | Yee | 428/389 |
| 4,281,211 | 7/1981 | Tatum et al. | 174/36 |
| 4,296,855 | 10/1981 | Blalock | 428/257 X |
| 4,362,779 | 12/1982 | Arsac | 428/263 |
| 4,375,009 | 2/1983 | Fearnside et al. | 174/36 |
| 4,376,229 | 3/1983 | Maul et al. | 174/35 R |
| 4,409,427 | 10/1983 | Plummer, III | 174/36 |
| 4,471,015 | 9/1984 | Ebneth et al. | 174/35 MS |

OTHER PUBLICATIONS

"X-Static" Product Brochure, Sauquoit Industries Inc., Scranton, Pa. (5 pages).
"Velcro" Product Brochure, Velcro USA, Inc., NY, NY, (1981, 2 pages).
Cerwin et al., Electri-onics, Aug. 1984, pp. 35-39.
"SEED" Product Brochure (1 page).
"Ground and Shielding Electronic Instrumentation" Course Brochure, University of Missouri-Rolla (1985, 1 page).
"Zip-Ex-2" Product Brochure, Shielding Technology Inc., London, England (1982, 6 pages).
IPCEA Pub. No. S-69-530 (2nd Ed, 1975), pp. E-11 to E-14 and F-1 to F-14.

Primary Examiner—Arthur T. Grimley
Assistant Examiner—Morris H. Nimmo
Attorney, Agent, or Firm—T. Gene Dillahunty

[57] ABSTRACT

This invention provides a fabric for RFI/EMI shielding wherein the fabric is woven, braided or warp knitted from yarns which comprise conductive fibers and nonconductive fibers wherein the conductive fibers comprise from about 10% to about 80% by weight of the fabric.

30 Claims, 6 Drawing Figures

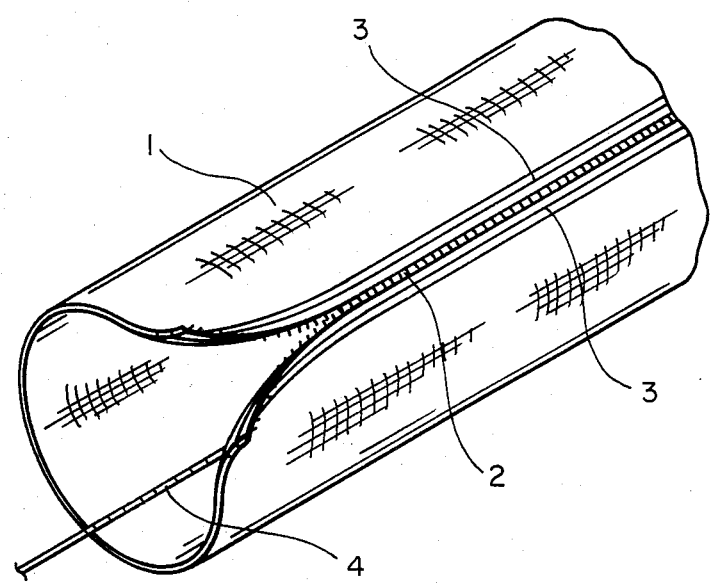
FIG_1
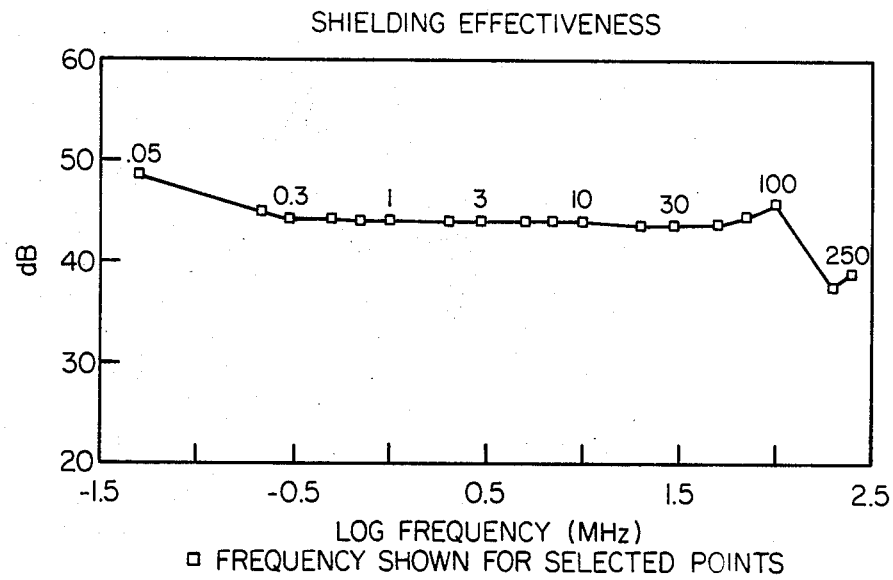
FIG_2

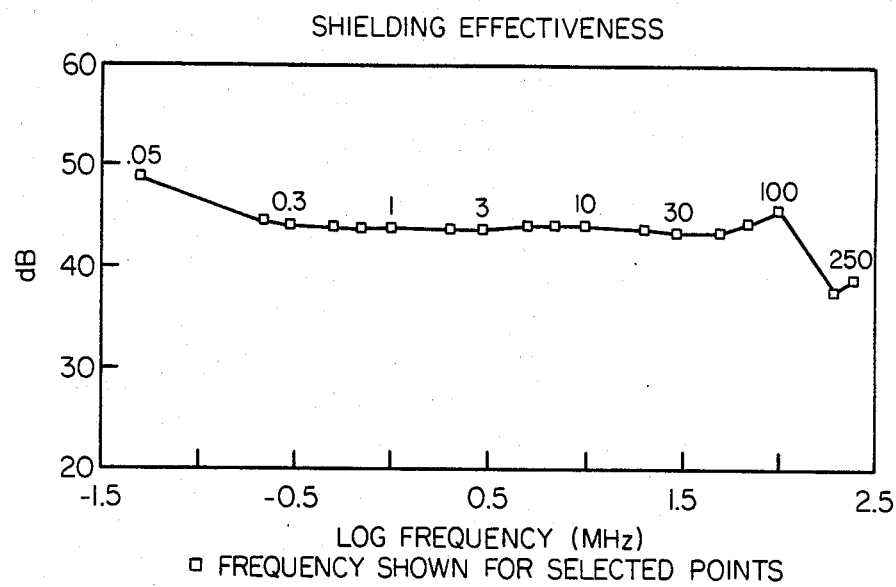
FIG_3
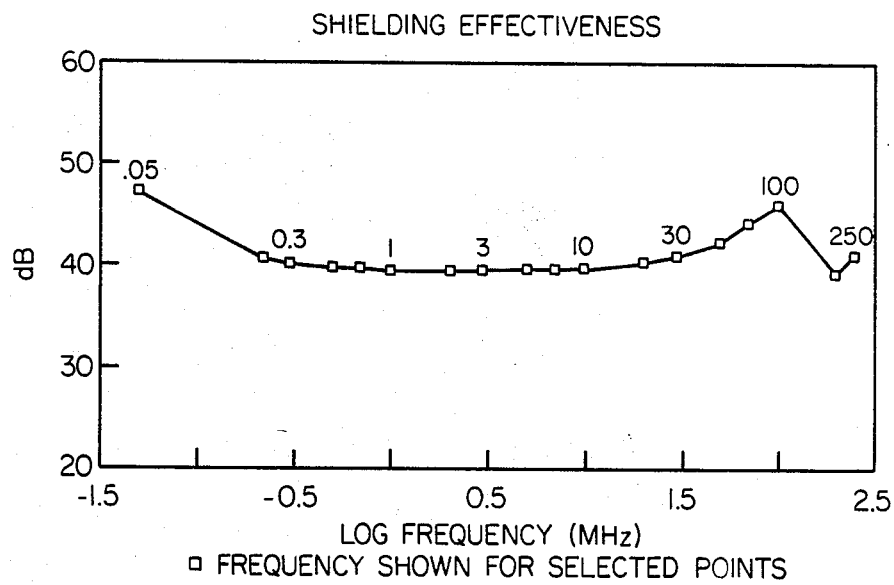
FIG_4

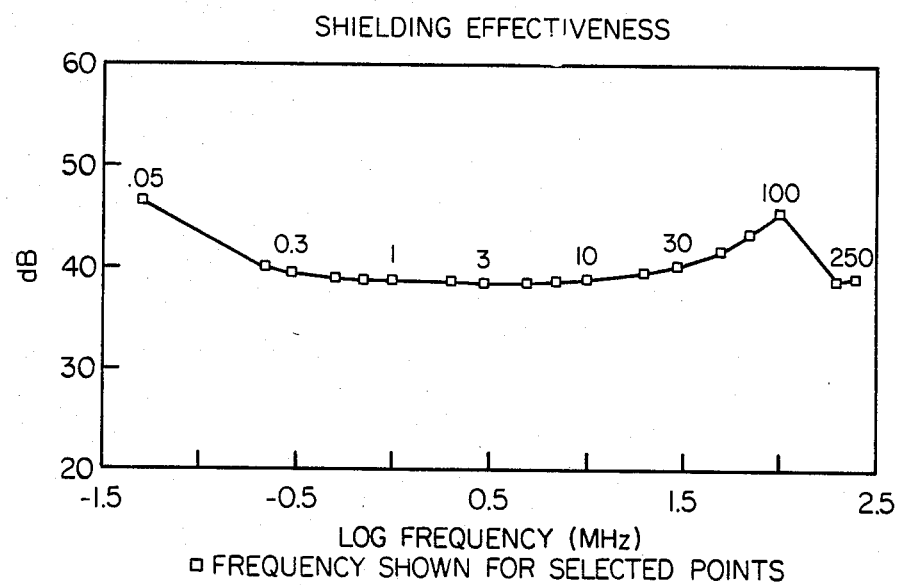
FIG_5
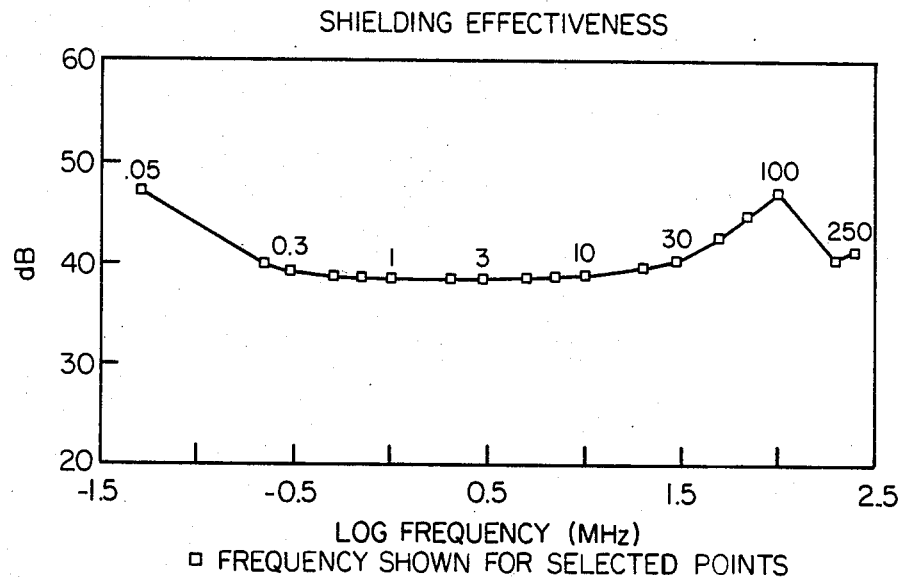
FIG_6

SHIELDING FABRIC

FIELD OF THE INVENTION

This invention relates to shielding of electrical conductors or other substrates from electromagnetic interference (EMI) and radio frequency interference (RFI) by providing a fabric which has effective shielding properties.

BACKGROUND OF THE INVENTION

RFI/EMI shielding of electrical conductors, cables and other components have conventionally been provided by wire overbraid, metal foils, metalized fabrics, and the like. Typical of such shielding are U.S. Pat. Nos. 3,946,143 and 4,016,356 to McLaughlin; and 3,089,915, 3,582,532 and 4,409,427 to Plummer. Commonly assigned copending application Ser. No. 670,698 filed Nov. 13, 1984, now abandoned, relates to a metalized fabric wraparound shielding product with a metalized non-conductive zipper closure. The disclosures of the above patents and application are incorporated herein by reference.

The metalized fabrics referred to in the copending application and the '427 Plummer patent are typically made by electroless plating or coating of plastic or non-conductive fibers as exemplified by U.S. Pat. Nos. 3,733,213 to Jacob; 3,877,965 to Broadbent et al.; and 4,247,596 to Yee, the disclosures of which are incorporated herein by reference. The conductive fibers of Broadbent et al. and others have been used in very low proportions such as 0.2% by weight in various fabrics such as carpets to help prevent static electricity build up.

BRIEF DESCRIPTION OF THE DRAWINGS

FIG. 1 an illustration of a preferred article according to this invention, which is a wraparound tubular article.

FIG. 2 shows in graphic form the shielding effectiveness of a tubular article according to this invention as set forth in Example 1.

FIG. 3 shows in graphic form the shielding effectiveness of a tubular article according to this invention as set forth in Example 2.

FIG. 4 shows in graphic form the shielding effectiveness of a tubular article according to this invention as set forth in Example 3.

FIG. 5 shows in graphic form the shielding effectiveness of a tubular article according to this invention as set forth in Example 4.

FIG. 6 shows in graphic form the shielding effectiveness of a wraparound form of the article of Example 4 made as described in Example 5.

DESCRIPTION OF THE INVENTION

It has previously been believed that in order to have effective RFI/EMI shielding using fabrics of conductive fibers or metalized fibers, the shielding had to constitute a closely woven fabric of essentially 100% conductive fibers, metalized fibers or other conductive elements such as wire. It has surprisingly been found that effective RFI/EMI shielding can be obtained from fabrics in which only a portion of the fibers are conductive fibers.

In one aspect, this invention provides a fabric for electrical shielding which comprises a fabric which is woven, braided or warp knitted from a yarn which comprises conductive fibers and non-conductive fibers wherein the conductive fibers comprise fibers of carbon, graphite or conductive polymer or comprise non-conductive fibers which are plated, coated or impregnated with a conductive material and wherein the conductive fibers comprise between about 10% and about 80% by weight of the fabric.

In another aspect, this invention provides a fabric for electrical shielding which is woven and comprises:

warp yarns which comprises conductive fibers and non-conductive fibers wherein the conductive fibers comprise fibers of carbon, graphite or conductive polymer or comprise non-conductive fibers which are plated, coated or impregnated with a conductive material and wherein the conductive fibers comprise between about 10% and about 80% by weight of the warp yarns; and filling yarns which comprise conductive fibers and nonconductive fibers wherein the conductive fibers comprise fibers of carbon, graphite or conductive polymer or comprise non-conductive fibers plated, coated or impregnated with a conductive material and wherein the conductive fibers comprise between about 1% and about 20% by weight of the filling yarns.

In another aspect, this invention provides an article for electrical shielding wherein the article is formed at least in part from a fabric which is woven, braided or warp knitted from a yarn which comprises conductive fibers and non-conductive fibers wherein the conductive fibers comprise fibers of carbon, graphite or conductive polymer or comprise non-conductive fibers which are plated, coated or impregnated with a conductive material and wherein the conductive fibers comprise between about 10% and about 80% by weight of the fabric.

In another aspect, this invention provides an assembly comprising a substrate and a fabric in shielding relationship therewith wherein the fabric is woven, braided or warp knitted from yarns which comprise conductive and non-conductive fibers wherein the conductive fibers comprise fibers of carbon, graphite or conductive polymer or comprise non-conductive fibers which are plated, coated or impregnated with a conductive material and wherein the conductive fibers comprise between about 10% and about 80% by weight of the fabric.

In another aspect, this invention provides a method of making fabric for electrical shielding which comprises weaving, braiding or warp knitting yarns which comprise conductive fibers and non-conductive fibers wherein the conductive fibers comprise fibers of carbon, graphite or conductive polymer or comprise non-conductive fibers which are plated, coated or impregnated with a conductive material and wherein the conductive fibers comprise between about 10% and about 80% by weight of the fabric.

In another aspect, this invention provides a method of electrically shielding a substrate which comprises placing in shielding relationship with the substrate a fabric which is woven, braided or warp knitted from yarns which comprise conductive fibers and non-conductive fibers wherein the conductive fibers comprise fibers of carbon, graphite or conductive polymer or comprise non-conductive fibers which are plated, coated or impregnated with a conductive material and wherein the conductive fibers comprise between about 10% and about 80% by weight of the fabric.

The non-conductive fibers useful in this invention include any non-conductive natural or synthetic fibers such as cotton, wool, silk, cellulose, polyester, polyamide, nylon, and the like. The conductive fibers useful in this invention include conductive fibers made from carbon, graphite or a conductive polymer or nonconductive fibers which can be plated, coated or impregnated with a conductive material and be able to retain that material for the length of time and under service conditions to be encountered by the shielding fabric. Depending on the durability, end use and other desirable properties for the shielding article made from the fabric, any combination of conductive and non-conductive fibers may be used. The conductive material plated, coated or impregnated on or in the fiber may be a metal, carbon, and the like. Some preferred conductive fibers include nylon plated with silver or copper, and polyester plated with silver, copper, nickel or tin.

The fabrics useful in this invention are made from yarns which comprise a blend of conductive and non-conductive fibers of the above mentioned types wherein the conductive fibers comprise between about 10% and about 80% by weight of the fabric. Preferably, the fabric should comprise between about 15% and about 70% by weight conductive fibers and most preferably between about 20% and about 60%. The yarns useful in this invention comprise a blend of conductive and non-conductive fibers wherein the conductive fibers comprise between about 20% and about 80% by weight of the yarn, except where the yarn is a second yarn in the fabric, such as the filling, the yarn may comprise as low as about 1% by weight conductive fiber. Preferably the yarn should comprise between about 30% and about 70% by weight conductive fibers and more preferably between about 35% and about 65%. Preferably a second yarn in the fabric, such as a filling yarn, should comprise between about 1% and about 20% by weight conductive fibers and more preferably between about 3% and about 15%.

The articles formed from the fabrics according to this invention will depend on the electrical device or other substrate to be shielded. For example, sheets of fabric may be used to shield cabinets for electronic equipment, electric terminals and connectors, while tubular shapes will be used to shield conductors and cables, including round or flat, ribbon cables. Various shapes may be made to shield other components.

Tubular articles according to this invention may be made in a wraparound configuration. Closure may be by overlapping the fabric and held in place by any suitable means. A preferred means of closure for a wraparound tubular article according to this invention is a non-conductive zipper which has been coated or plated with a conductive metal and bonded or fused to the edges of the fabric forming the wraparound. In this respect, see copending application U.S. Ser. No. 670,698 filed Nov. 13, 1984, now abandoned. Hook and loop closures coated with metal may be used as the closure means, e.g., the VELCRO and HI-MEG products available from Velcro USA, Inc.

It is also useful to include in the fabric of this invention a drainwire or ground wire. The drainwire is conveniently incorporated as a warp strand in a woven fabric. More than one drainwire can be used depending on the desired grounding configuration and the shielding effectiveness required. In general one to four drainwires in the warp direction in a tubular article are sufficient. The drainwire may be stranded copper, tinned or silvered copper, or other material useful as a flexible ground wire.

FIG. 1 illustrates a wraparound tubular article according to this invention. Fabric sheet 1 has zipper closure 2 attached to opposing edges of the fabric sheet along lines 3. The wraparound tubular article optionally contains a metalic ground strap or drainwire 4 which aids in connecting the wraparound tubular article to a grounding means.

The invention can be further understood by reference to the following examples. In these examples, the silver plating on the polyester and nylon yarns was basically applied by the processes disclosed in U.S. Pat. No. 3,877,965 to Broadbent et al.

EXAMPLE 1

In this example, a first yarn was prepared from one end of a 525 denier multifill nylon yarn having 20% by weight silver plated thereon ("X-Static" yarn from Sauquoit Industries, Inc.), which was blended by simply a ply and twist with two ends of 300 denier texturized polyester yarn. The resulting twisted first yarn was 1200 denier. A second yarn was prepared from 50 denier multifill nylon yarn having 12% silver plated thereon ("X-Static" yarn) twisted with four ends of 300 denier texturized polyester. The resulting second yarn was 1250 denier. A fabric was woven using the first yarn in the warp and the second yarn in the filling. The fabric was woven in tubular form which when flattened into a tape was 1¾ inch wide. The fabric was woven to a density of 50 face ends per inch and 11 face picks per inch. A sample of this tubular article was tested in accordance with NEMA Pub. No. WC 41-1975, Part 3 with a 5 volt input on a sample 0.5 meters in length. (See also ELECTRI-ONICS, Aug. 1984, pp. 35-39.) The shielding effectiveness is depicted in FIG. 2 in terms of dB attenuation versus frequency.

EXAMPLE 2

In this example, a first yarn was prepared as in Example 1 and a second yarn was prepared from spun nylon yarns as follows. A 300 denier spun nylon yarn was made using 4% by weight "X-Static" staple (nylon with 12% silver from Sauquoit Industries) and 96% nylon staple. Two ends of this 300 denier yarn was twisted with one end of 27 denier multifill nylon "X-Static" yarn (12% silver) to give a 627 denier yarn, two ends of which were twisted resulting in a yarn having 1254 denier and 8% by weight conductive fibers. A fabric was prepared as in Example 1 using the first yarn in the warp and the second yarn in the filling. This fabric was formed in a tubular article as in Example 1 and tested in accordance with Example 1. The shielding effectiveness is set forth in graphic form in FIG. 3.

EXAMPLE 3

In this example, a 500 denier multifil nylon yarn having 12% by weight silver plated thereon was twisted with two ends of a 300 denier texturized polyester producing a twisted first yarn having a total size of 1100 denier. A second yarn used in this invention is the same as the second yarn in Example 1. A fabric was woven in accordance with Example 1 using the first yarn in the warp and the second yarn in the fill. The same tubular article was formed and tested in accordance with Example 1. The shielding effectiveness is set forth in graphic form in FIG. 4.

EXAMPLE 4

First and second yarns were prepared as in Example 3 and woven into a fabric as in Example 3 except that in the warp two stripes were inserted using a multifil nylon yarn of 1130 denier. The nylon yarn was made from one end of 500 denier multifil nylon plated with 12% by weight silver and three ends of 210 denier nylon multifilament which produced a nylon yarn having a total size of 1130 denier. Each stripe was 3/16 inch wide with ⅜ inch between the stripes of nylon. A sample of this tubular article was tested in accordance with Example 1 and the shielding effectiveness is set forth in FIG. 5.

EXAMPLE 5

Example 4 was repeated except that a nylon zipper plated with silver was ultrasonically bonded to the stripes of nylon yarn and the tubular article split under the center of the zipper to form a wraparound article. This sample was tested as in Example 4 and the shielding effectiveness is set forth in FIG. 6.

What is claimed is:

1. A fabric for electrical shielding which comprises a fabric which is woven, braided or warp knitted from a yarn which comprises conductive fibers and non-conductive fibers wherein the conductve fibers comprise fibers of carbon, graphite or conductive polymer or comprise non-conductive fibers which are plated, coated or impregnated with a conductive material and wherein the conductive fibers comprise between 10% and about 80% by weight of the fabric.

2. A fabric according to claim 1 wherein the conductive fibers comprises non-conductive fibers plated or coated with metal.

3. A fabric according to claim 2 wherein the conductive fibers comprise between about 15% and about 70% by weight of the fabric.

4. A fabric according to claim 3 wherein the conductive fibers comprise between about 20% and about 60% by weight of the fabric.

5. A fabric according to claim 2 wherein the fabric comprises:
   warp yarns in which the conductive fibers comprise between about 20% and about 80% by weight of the yarn; and
   filling yarns in which the conductive fibers comprise between about 1% and about 20% by weight of the yarn.

6. A fabric according to claim 5 wherein the yarns comprise one selected from the group of nylon or polyester.

7. A fabric according to claim 6 wherein the conductive yarns comprise nylon plated with silver.

8. A fabric according to claim 6 wherein the warp yarns comprise between about 30% and about 70% conductive fibers by weight.

9. A fabric according to claim 7 wherein the warp yarns comprise between about 30% and about 70% conductive fibers by weight.

10. An article for electrical shielding wherein the article is formed at least in part from a fabric which comprises woven, braided or warp knitted yarn which comprises conductive fibers and non-conductive fibers wherein the conductive fibers comprise fibers of carbon, graphite or conductive polymer or comprise non-conductive fibers which are plated, coated or impregnated with a conductive material and wherein the conductive fibers comprise between about 10% and about 80% by weight of the fabric.

11. An article according to claim 10 wherein the fabric comprises:
   warp yarns in which the conductive fibers comprise between about 20% and about 80% by weight of the yarn; and
   filling yarns in which the conductive fibers comprise between about 1% and about 20% by weight of the yarn.

12. An article according to claim 11 which is a tubular article.

13. An article according to claim 12 wherein the tubular article is a wraparound article.

14. An article according to claim 13 wherein the wraparound closure means comprises a non-conductive zipper which is plated or coated with a metal.

15. An article according to claim 13 wherein the yarns comprise one selected from the group of nylon or polyester.

16. An article according to claim 15 wherein the conductive yarns comprise nylon plated with silver.

17. An article according to claim 12 wherein the yarns comprise one selected from the group of nylon or polyester.

18. An article according to claim 17 wherein the conductive yarns are nylon plated with silver.

19. An article according to claim 14 wherein the yarns comprise nylon or polyester and the conductive yarns comprise nylon plated with silver.

20. An assembly comprising a substrate and a fabric in shielding relationship therewith wherein the fabric is woven, braided or warp knitted from yarns which comprise conductive and non-conductive fibers and non-conductive fibers wherein the conductive fibers comprise fibers of carbon, graphite or conductive polymer or comprise non-conductive fibers which are plated, coated or impregnated with a conductive material and wherein the conductive fibers comprises between about 10% and about 80% by weight of the fabric.

21. An assembly according to claim 20 wherein the conductive fibers comprise non-conductive fibers plated or coated with metal.

22. An assembly according to claim 21 wherein the conductive fibers comprise between about 15% and about 70% by weight of the fabric.

23. An assembly according to claim 22 wherein the conductive fibers comprise between about 20% and about 60% by weight of the farbic.

24. An assembly according to claim 21 wherein the conductive yarns comprise nylon plated with silver.

25. A method of making fabric for electrical shielding which comprises weaving, braiding or warp knitting yarns which comprise conductive fibers and non-conductive fibers wherein the conductive fibers comprise fibers of carbon, graphite or conductive polymer or comprise non-conductive fibers which are plated, coated or impregnated with a conductive material and wherein the conductive fibers comprise between about 10% and about 80% by weight of the fabric.

26. A method according to claim 25 comprising weaving, braiding or warp knitting conductive fibers which comprises non-conductive fibers plated or coated with metal.

27. A method according to claim 26 comprising weaving, braiding or warp knitting a fabric wherein the conductive fibers comprise between about 15% and about 70% by weight of the fabric.

28. A method according to claim 27 comprising weaving, braiding or warp knitting a fabric wherein the conductive fibers comprise between about 20% and about 60% by weight of the fabric.

29. A method according to claim 27 comprising weaving, braiding or warp knitting conductive fibers which comprise nylon plated with silver.

30. A method of electrically shielding a substrate which comprises placing in shielding relationship with the substrate a fabric which is woven, braided or warp knitted from yarns which comprise conductive fibers and non-conductive fibers wherein the conductive fibers comprise fibers of carbon, graphite or conductive polymer or comprise non-conductive fibers which are plated, coated or impregnated with a conductive material and wherein the conductive fibers comprise between about 10% and about 80% by weight of the fabric.

* * * * *